United States Patent
Lee et al.

(10) Patent No.: US 8,820,979 B2
(45) Date of Patent: Sep. 2, 2014

(54) ASYMMETRIC TYPE LENS AND STREET LAMP INCLUDING THE SAME

(75) Inventors: Chang Mo Lee, Chuncheon-si (KR); Ki Un Lee, Suwon-si (KR); Sang Ho Yoon, Yongin-si (KR); Dae Il Seok, Suwon-si (KR); Seung Gyun Jung, Seoul (KR); Joung Wook Park, Gwangju (KR); Jin Pyo Hong, Gwangju (KR); Jae Yeong Joo, Gwangju (KR); Gi Hoon Kim, Gwangju (KR); Sang Bin Song, Gwangju (KR); Bo Hyun Jo, Gwangju (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 5 days.

(21) Appl. No.: 13/423,827

(22) Filed: Mar. 19, 2012

(65) Prior Publication Data

US 2013/0051030 A1      Feb. 28, 2013

(30) Foreign Application Priority Data

Aug. 30, 2011   (KR) .......................... 10-2011-0087265

(51) Int. Cl.
| | |
|---|---|
| *F21V 5/04* | (2006.01) |
| *F21S 13/10* | (2006.01) |
| *H01L 33/58* | (2010.01) |
| *G02B 19/00* | (2006.01) |
| *F21W 131/103* | (2006.01) |
| *F21Y 101/02* | (2006.01) |

(52) U.S. Cl.
CPC ............. *G02B 19/0061* (2013.01); *Y02B 20/72* (2013.01); *F21W 2131/103* (2013.01); *H01L 33/58* (2013.01); *G02B 19/0014* (2013.01); *F21Y 2101/02* (2013.01); *F21V 5/04* (2013.01)

USPC ...................... 362/311.02; 362/338; 362/431

(58) Field of Classification Search
USPC ............ 362/309, 310, 311.02, 334, 338, 431, 362/555
See application file for complete search history.

(56) References Cited

U.S. PATENT DOCUMENTS 7,618,163 B2 * 11/2009 Wilcox ......................... 362/336
7,841,750 B2 * 11/2010 Wilcox et al. ................ 362/334
(Continued)

FOREIGN PATENT DOCUMENTS

| CA | 2 776 733 A1 | 4/2011 |
|---|---|---|
| EP | 2 280 216 | 2/2011 |

(Continued)

OTHER PUBLICATIONS

Chinese Office Action, w/ English translation thereof, issued in Chinese Patent Application No. CN 201210316906.5 dated Dec. 17, 2013.

*Primary Examiner* — Peggy Neils
(74) *Attorney, Agent, or Firm* — McDermott Will & Emery LLP

(57) ABSTRACT

A lens is provided in an asymmetric shape including at least two curved surfaces with different light distribution angles. Therefore, uniformity ratio of illuminance and coefficient of utilization (CU) may be increased while reducing dazzle. When a lighting apparatus including the lens is used as a street light, light directly incident to a driver is minimized, thereby reducing dazzle to the driver. During a night drive, brightness at a far forward position of the driver may be increased. In addition, light emitted toward a street may be increased while reducing light emitted toward a sidewalk. As a result, uniformity ratio of illuminance and coefficient of utilization (CU) may be increased. Also, light pollution may be reduced.

8 Claims, 4 Drawing Sheets

(56) References Cited

U.S. PATENT DOCUMENTS

| | | | |
|---|---|---|---|
| 8,215,814 B2* | 7/2012 | Marcoux | 362/555 |
| 8,220,974 B2* | 7/2012 | Chen et al. | 362/326 |
| 8,240,886 B2* | 8/2012 | Lai | 362/309 |
| 8,434,914 B2* | 5/2013 | Li et al. | 362/335 |
| 8,449,149 B2* | 5/2013 | Chang et al. | 362/311.06 |
| 2009/0225551 A1* | 9/2009 | Chang et al. | 362/311.06 |
| 2010/0073938 A1 | 3/2010 | Ho | |

FOREIGN PATENT DOCUMENTS

| | | |
|---|---|---|
| JP | 2010-028043 | 2/2010 |
| JP | 2010-034046 | 2/2010 |
| KR | 10-2010-0123194 | 11/2010 |
| TW | 200938770 A | 9/2009 |
| WO | WO 2011/042837 | 4/2011 |

* cited by examiner

ASYMMETRIC TYPE LENS AND STREET LAMP INCLUDING THE SAME

CROSS-REFERENCE TO RELATED APPLICATION

This application claims the benefit of Korean Patent Application No. 10-2011-0087265, filed on Aug. 30, 2011, in the Korean Intellectual Property Office, the disclosure of which is incorporated herein by reference.

BACKGROUND

1. Field of the Invention

The present invention relates to an asymmetric lens and a street light including the asymmetric lens, and more particularly, to an asymmetric lens that reduces dazzle while increasing uniformity ratio of illuminance and coefficient of utilization (CU), and a street light including the asymmetric lens.

2. Description of the Related Art

Generally, lighting such as a street light is vertically installed along either side of a street to supply, at night, light onto the street or the surrounding area. Conventionally, a sodium (Na) lamp, a mercury (Hg) lamp, and a metal halide lamp have been generally used for the lighting. However, those conventional lamps consume a great deal of electricity, have a short use life, lead to a high cost for maintenance and repair, and also cause environmental pollution.

Therefore, a light emitting diode (LED) in the lighting is epoch-making in the field of lighting. The LED refers to a semiconductor device that emits light when a current flows. Due to a long lifespan, low power consumption, high response rate, and excellent initial driving characteristics, and the like, the LED is widely applied to various fields including a lighting apparatus, an electric sign, a back light unit of a display device, and the like. Also, the number of fields the LED is being applied to is increasing.

The LED has an excellent light quality in terms of a spectrum of light emitted from an LED light source, and a high emission efficiency and energy saving efficiency. Therefore, at present, the LED is being used widely for lighting of a street light. Outdoor lighting such as the street light using the LED generally collects light rays by a lens mounted to a cover of the lighting. However, a conventional circular lens has a circular light field in which brightness is greatly different between a center and a periphery.

Furthermore, in practical use of the LED lighting, a light range needs to be increased in a certain direction and decreased in another direction.

For example, in a case of street lighting, the light range and the lighting efficiency need to be high in an extending direction of a street. Also, a lighting angle needs to be great. However, in a direction perpendicular to the street extending direction, the light range needs to be low such that wasting of electricity and light pollution are reduced.

When an LED street light applying a conventional circular lens is used, a large number of lights are installed on the street extending direction so as to achieve a desired lighting effect.

In this case, light fields overlap between neighboring lights, thereby increasing brightness. However, since distribution of light intensity is not uniform, the light fields shown on the street may alternate repetition of a bright portion and a dark portion, that is, in the form of ribs. That is, the brightness is high only right under the light but low in the other positions, thereby causing a low average brightness and non-uniform brightness of the street. This may confuse a driver on the street and may even cause a traffic accident. That is, the non-uniform and low brightness of street lights may seriously affect driving safety and cause traffic accidents.

Moreover, in various outdoor and indoor environments aside from thoroughfares, stray light may cause pollution to the surrounding and a dazzle problem.

SUMMARY

An aspect of the present invention provides an asymmetric lens that reduces dazzle while increasing uniformity ratio of illuminance and coefficient of utilization (CU), and a street light including the asymmetric lens.

According to an aspect of the present invention, there is provided a lens including at least two curved surfaces to transmit light generated from a light emitting diode (LED), wherein light distribution angles of light passing through the at least two curved surfaces are different.

The at least two curved surfaces may be asymmetric.

The at least two curved surfaces may be defined by border lines and have different curvatures with reference to the border lines.

The border lines may include a first border line extending in a width direction of the lens and a second border line extending in a length direction of the lens.

The at least two curved surfaces may be divided into a first region and a second region with respect to the first border line, light passing through the first region may advance to one side with respect to the first border line, and light passing through the second region may advance to the other side with respect to the first border line.

The at least two curved surfaces may be divided into a third region and a fourth region with respect to the second border line, light passing through the third region may advance to one side with respect to the second border line, and light passing through the fourth region may advance to the other side with respect to the second border line.

The first region may include a first curved surface and a second curved surface, and the second region may include a third curved surface and a fourth curved surface.

The third region may include a second curved surface and a fourth curved surface, and the fourth region may include a first curved surface and a third curved surface.

According to another aspect of the present invention, there is provided a street light including a support pole installed on a ground; a lighting apparatus mounted to the support pole and configured to include a lens which includes at least two curved surfaces configured to transmit light generated from an LED, wherein light distribution angles of light passing through the at least two curved surfaces are different.

The at least two curved surfaces may be asymmetric.

The at least two curved surfaces may be defined by border lines and have different curvatures with reference to the border lines.

The border lines may include a first border line extending in a width direction of the lens and a second border line extending in a length direction of the lens, and the at least two curved surfaces may be divided into a first region and a second region. Light passing through the first region may advance to one side with respect to the first border line and light passing through the second region may advance to the other side with respect to the first border line.

The first region may include a first curved surface and a second curved surface, and the second region may include a third curved surface and a fourth curved surface.

The border lines may include a first border line extending in a width direction of the lens and a second border line extending in a length direction of the lens, and the at least two curved surfaces may be divided into a third region and a fourth region with respect to the second border line. Light passing through the third region may advance to one side with respect to the second border line and light passing through the fourth region may advance to the other side with respect to the second border line.

The third region may include a second curved surface and a fourth curved surface and the fourth region may include a first curved surface and a third curved surface.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

In the description of embodiments, it will be understood that when a region, surface, or part is referred to as being 'on' or 'under' another a region, surface, or part, the terminology of 'on' and 'under' includes both the meanings of 'directly' and 'indirectly'. Further, the reference about 'on' and 'under' each layer will be made on the basis of drawings.

In addition, the sizes of the elements and the relative sizes between elements may be exaggerated for further understanding of the present invention and are not limited to actual sizes.

Hereinafter, an asymmetric lens and a street light including the asymmetric lens will be described in detail to exemplary embodiments of the present invention, examples of which are illustrated in the accompanying drawings.

Figure 1:
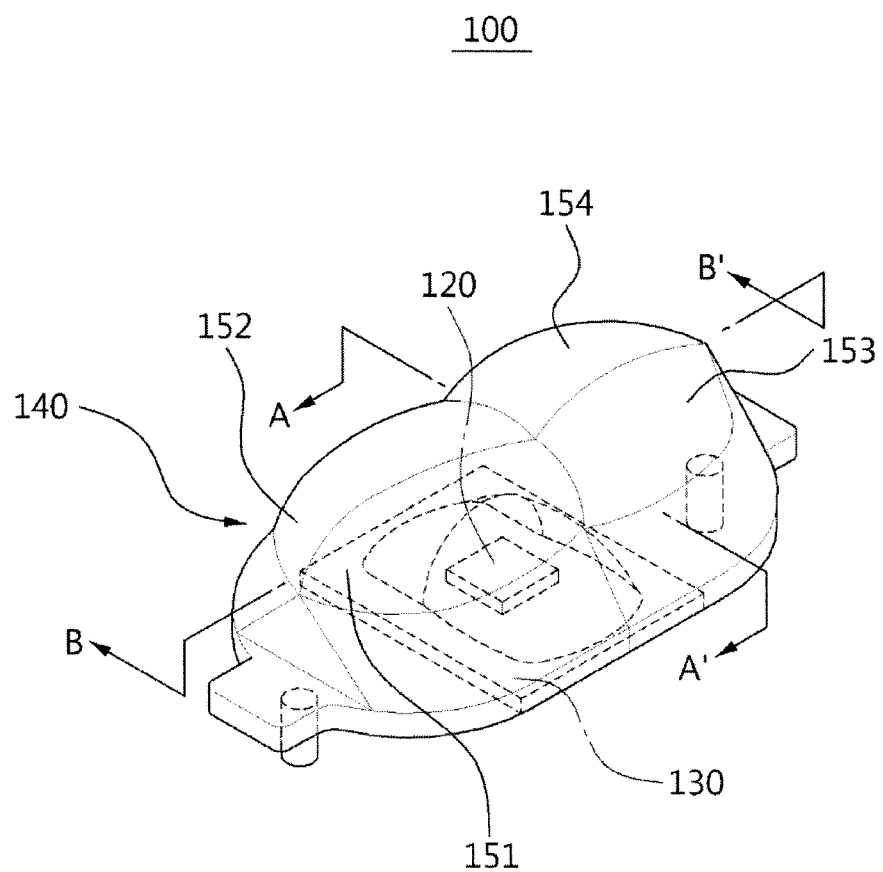
FIG. 1 is a perspective view illustrating a lighting apparatus including an asymmetric lens according to an embodiment of the present invention.
Figure 2A:
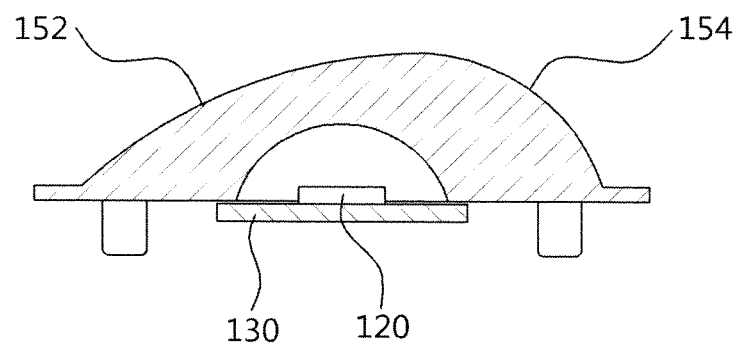
FIGS. 2A and 2B are sectional views of the asymmetric lens shown in FIG. 1, seen from border lines B-B' and A-A' of FIG. 1, respectively.
Figure 2B:
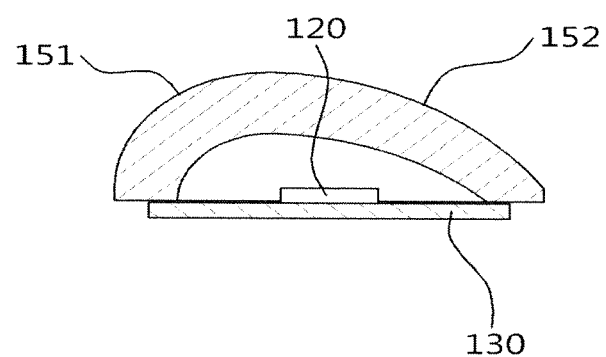
Figure 3:
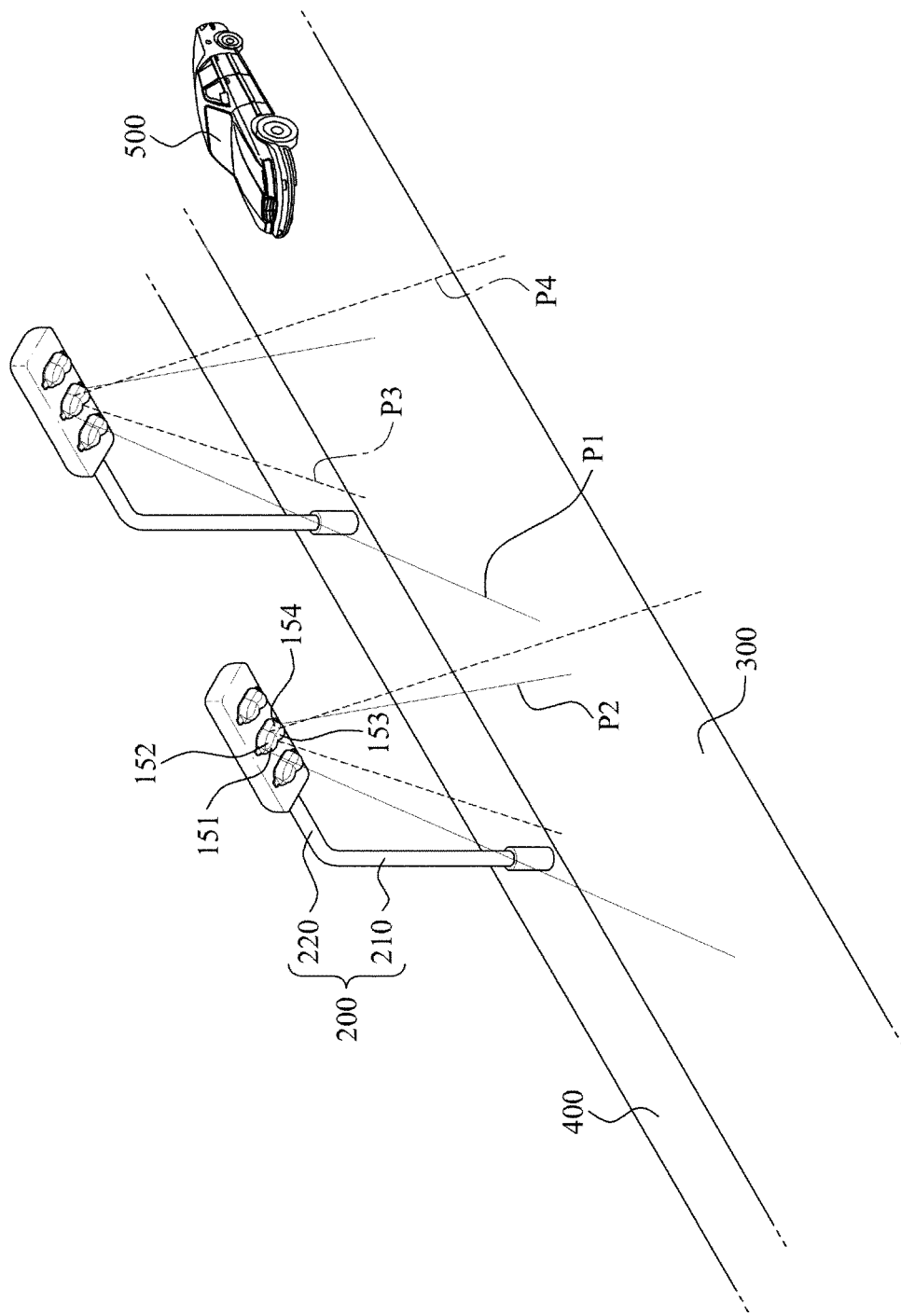
FIG. 3 is a diagram illustrating usage of a street light applying the asymmetric lens shown in FIG. 1.

FIG. 1 is a perspective view illustrating a lighting apparatus including an asymmetric lens 140 according to an embodiment of the present invention. FIGS. 2A and 2B are sectional views of the asymmetric lens shown in FIG. 1, seen from border lines B-B' and A-A' of FIG. 1, respectively. FIG. 3 is a diagram illustrating usage of a street light applying the asymmetric lens shown in FIG. 1.

Referring to FIGS. 1, 2A, and 2B, the asymmetric lens 140 may include at least two curved surfaces to transmit light generated from a light emitting diode (LED) 120. Although the asymmetric lens 140 will be described to include four curved surfaces 151, 152, 153 and 154 as the at least two curved surfaces, according to the present embodiment, it is not limited thereto.

The at least two curved surfaces 151, 152, 153 and 154 may be asymmetric with respect to one another. Light distribution angles of light passing through the at least two curved surfaces 151, 152, 153 and 154 may be different, respectively.

That is, since the at least two curved surfaces 151, 152, 153 and 154 are asymmetric, the light distribution angles of emitted light may be varied according to an environment in which the lighting apparatus including the asymmetric lens 140 is installed. Here, the curvature denotes a radius of curvature.

The at least two curved surfaces 151, 152, 153 and 154 included in the asymmetric lens 140 may be defined by border lines and have different curvatures from one another with reference to the border lines.

The border lines may include a first border line A-A' extending in a width direction of the asymmetric lens 140 and a second border line B-B' extending in a length direction of the asymmetric lens 140. Hereinafter, a particular border line will be described as a reference of a cross section, which means curved surfaces having the same cross section with respect to the particular border line belong to the same region. That is, with respect to the particular border line, curved surfaces having the same gradient and the same inclination of a tangent line may belong to the same region.

When the first border line A-A' is the reference of a cross section, the at least two curved surfaces 151, 152, 153 and 154 may be divided into a first region and a second region. The first region may include the curved surfaces 151 and 152 while the second region includes the curved surfaces 153 and 154.

That is, when the first border line A-A' is the reference of a cross section, the curved surfaces 151 and 152 belonging to the first region and the curved surfaces 153 and 154 belonging to the second region have the same gradient and the same inclination of a tangent line and therefore emit light in the same direction. In this case, the curved surfaces 151 and 152 have a relatively gentle curve such that the light passing through the first region advances toward one side at a wide light distribution angle. The curved surfaces 153 and 154 have a relatively steep curve such that the light passing through the second region advances toward another side at a narrow light distribution angle.

Referring to FIG. 2A, when the first border line A-A' is the reference of a cross section, a first curved surface 151 may be relatively gentle while a third curved surface 153 is relatively steep. That is, the first curved surface 151 may have a smaller inclination of a tangent line than the third curved surface 153. Also, a second curved surface 152 may be relatively gentle like the first curved surface 151 while a fourth curved surface 154 is relatively steep like the third curved surface 153. Accordingly, as shown in FIG. 3, light emitted through the first curved surface 151 and the second curved surface 152 may be focused to a far position P1 in a running direction of a car 500, thereby supplying a proper amount of illumination onto a street. Light emitted through the third curved surface 153 and the fourth curved surface 154 may be focused to a nearby position P2 in the opposite direction to the running direction of the car 500, thereby reducing dazzle to a driver.

In addition, the at least two curved surfaces 151, 152, 153, and 154 may be divided into a third region and a fourth region. The third region may include the curved surfaces 152 and 154 while the fourth region includes the curved surfaces 151 and 153.

That is, when the second border line B-B' is the reference of a cross section, the curved surfaces 152 and 154 belonging to the third region and the curved surfaces 151 and 153 belonging to the fourth region have the same gradient and the same inclination of a tangent line and therefore emit light in the same direction. In this case, the curved surfaces 152 and 154 have a relatively gentle curve such that the light passing through the third region advances toward one side at a wide light distribution angle. The curved surfaces 151 and 153 have a relatively steep curve such that the light passing through the fourth region advances toward another side at a narrow light distribution angle.

Referring to FIG. 2B, when the second border line B-B' is the reference of a cross section, the second curved surface 152 may be relatively gentle while the first curved surface 151 is relatively steep. That is, the second curved surface 152 may have a smaller inclination of a tangent line than the first curved surface 151. Also, the fourth curved surface 154 may be relatively gentle like the second curved surface 152 while the third curved surface 153 is relatively steep like the first curved surface 151. Accordingly, light emitted through the second curved surface 152 and the fourth curved surface 154 may be focused to a far position P4 in a direction toward the street, thereby supplying a proper amount of illumination onto a street. Light emitted through the first curved surface 151 and the third curved surface 153 may be focused to a nearby position P3 in a direction toward a sidewalk, thereby reducing light pollution.

Thus, the inclination of a tangent line of the first curved surface 151 is relatively gentle when the first border line A-A' is the reference of a cross section, and is relatively steep when the second border line B-B' is the reference of a cross section. In a case of the second curved surface 152, the inclination of a tangent line is relatively gentle when the first border line A-A' is the reference of a cross section, and also relatively gentle when the second border line B-B' is the reference of a cross section. In a case of the third curved surface 153, the inclination of a tangent line is relatively steep when the first border line A-A' is the reference of a cross section, and also relatively steep when the second border line B-B' is the reference of a cross section. In a case of the fourth curved surface 154, the inclination of a tangent line is relatively steep when the first border line A-A' is the reference of a cross section, and is relatively gentle when the second border line B-B' is the reference of a cross section.

The asymmetric lens 140 may be made of materials selected from a group consisting of glass, quartz, epoxy resin, silicone resin, polycarbonate (PC), and polymethyl methacrylate.

Referring to FIG. 3, a street light to which the asymmetric lens 140, according to the embodiment of the present invention, is applied will be described in further detail.

Referring to FIGS. 1 to 3, the street light includes a support pole 200 and a lighting apparatus 100. The support pole 200 includes a main pole 210 and an arm 220 extending from the main pole 210.

The lighting apparatus 100 is connected to one end of the arm 220 and configured to emit light toward a street 300 and a sidewalk 400. The lighting apparatus 100 may include the LED 120, a substrate 130 mounting the LED 120, and the asymmetric lens 140 through which light emitted from the LED 120 is passed and advanced.

As shown in FIG. 3, the asymmetric lens 140 may include four curved surfaces configured to emit, in different directions, an incident light emitted from a light source of the street light through total reflection and refraction, respectively. Therefore, light from a plurality of the street lights installed at uniform intervals on the sidewalk 400 extending along one side of the street 300 may form a predetermined distribution pattern.

The four curved surfaces may include a first region and a second region formed in the width direction of the curved surface 140, and a third region and a fourth region formed in the length direction of the curved surface 140. Here, the first region may include the first curved surface 151 and the second curved surface 152 while the second region includes the third curved surface 153 and the fourth curved surface 154. The third region may include the second curved surface 152 and the fourth curved surface 154 while the fourth region includes the first curved surface 151 and the third curved surface 153.

In the following description, a longitudinal direction of the street 300 corresponds to the length direction of the asymmetric lens 140. A lateral direction of the street light 300 corresponds to the width direction of the asymmetric lens 140. In addition, the longitudinal direction of the street 300 may correspond to the running direction of the car 500 while the lateral direction of the street 300 corresponds to a direction perpendicular to the running direction of the car 500.

First, the curved surfaces of the asymmetric lens 140 will be described in relation to the running direction of the car 500. That is, the curved surfaces included in the first region and the second region with respect to the first border line A-A' as the reference of a cross section will be described.

As shown in FIG. 3, the first curved surface 151 and the second curved surface 152 may be configured in such a manner that light emitted in the running direction of the car 500 forms a wide light distribution angle in a direction perpendicular to a ground surface. Accordingly, the first curved surface 151 and the second curved surface 152 may focus the light advancing through the first curved surface 151 and the second curved surface 152 in the running direction of the car 500, to the far position P1 in the running direction of the car 500 running in the longitudinal direction of the street 300 with a wide light distribution angle of the light with respect to the direction perpendicular to the ground surface.

Figure 4:
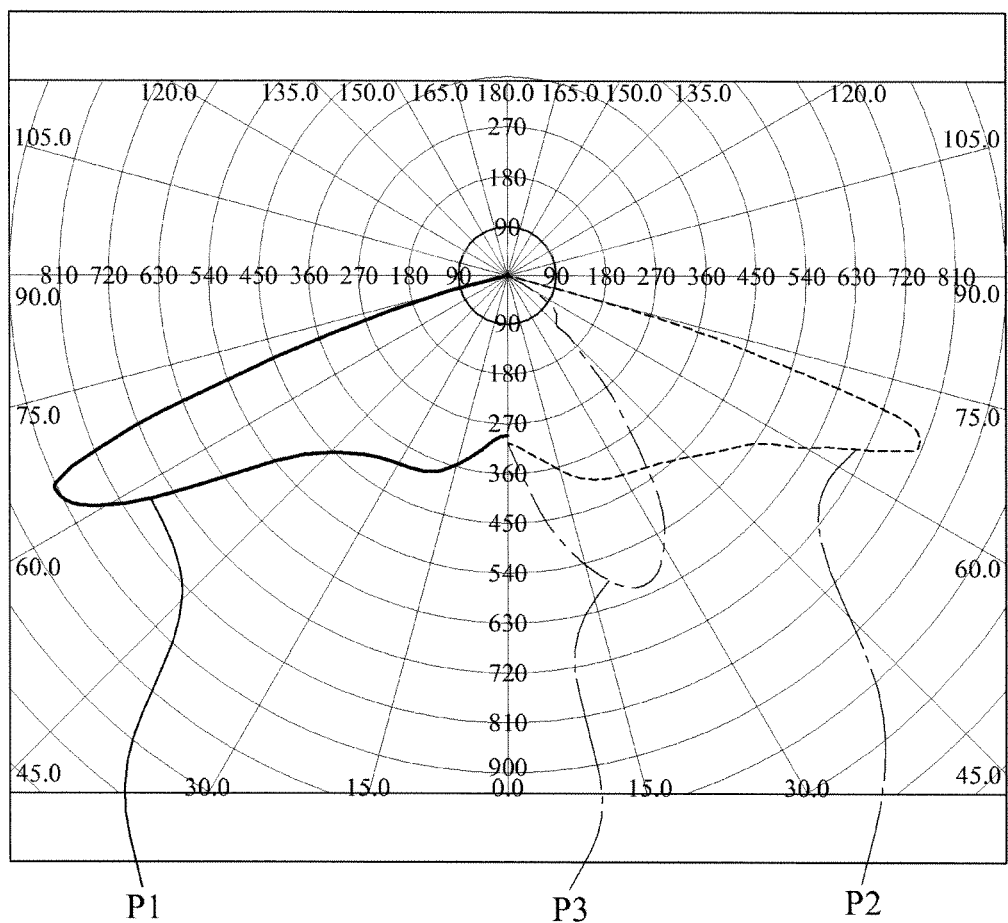
FIG. 4 is a diagram illustrating a light distribution pattern of an asymmetric lens according to an embodiment of the present invention.

That is, when the incident light from the LED 120 mounted to the substrate 130 is advanced through the first curved surface 151 and the second 152 through total reflection and refraction in the asymmetric lens 140, the light distribution angle of the first curved surface 151 and the second curved surface 152 may be formed such that the light from the light source is focused to the far position P1 in the running direction of the car 500. This can be understood from a light distribution pattern shown in FIG. 4.

As shown in FIG. 3, the third curved surface 153 and the fourth curved surface 154 may focus light in a direction opposite to a direction of the light advanced through the first curved surface 151 and the second curved surface 152, at an angle smaller than the light distribution angle formed by the first curved surface 151 and the second curved surface 152. That is, the light distribution angle of the third curved surface 153 and the fourth curved surface 154 may be formed such that the light advanced through the third curved surface 153 and the fourth curved surface 154 is focused to a middle-distance position or the nearby position P2 in the opposite direction to the running direction of the car 500. This can be understood from the light distribution pattern shown in FIG. 4.

The first curved surface 151 and the second curved surface 152 may supply a proper amount of illumination to the street 300 by delivering the light to the far position in the same direction as the running direction of the car 500.

Conversely, the third curved surface 153 and the fourth curved surface 154 may deliver the light to a middle-distance position or a nearby position in the opposite direction to the running direction of the car 500, thereby minimizing a quantity of light directly incident to the driver and also minimizing dazzle to the driver.

Hereinafter, the curved surfaces of the asymmetric lens 140 will be described in relation to the street 300 and the sidewalk 400. That is, the curved surfaces included in the third region and the fourth region with respect to the second border line B-B' as the reference of a cross section will be described.

As shown in FIG. 3, the second curved surface 152 and the fourth curved surface 154 may be configured in such a manner that light is focused to the far position P4 in the lateral direction of the street 300 with a wide light distribution angle of the light with respect to the length direction of the asymmetric lens 140, with respect to the direction perpendicular to the ground surface. That is, the second curved surface 152 and the fourth curved surface 154 may form the light distribution angle such that the light is focused mostly to the street 300.

As shown in FIG. 3, the first curved surface 151 and the third curved surface 153 may form an angle smaller than the light distribution angle formed by the second curved surface 152 and the fourth curved surface 154. That is, the light distribution angle may be formed such that the light is advanced toward the nearby position P3 in a direction toward the sidewalk 400, that is, in a direction opposite to a direction of the light advanced through the second curved surface 152 and the fourth curved surface 154 with respect to the length direction of the asymmetric lens 140. That is, the first curved surface 151 and the third curved surface 153 may form the light distribution angle such that the light is advanced to a short distance toward the sidewalk 400, that is, within a surface of the street 300, with respect to the length direction of the asymmetric lens 140.

As described in the foregoing, the first curved surface 151 to the fourth curved surface 154 are in an asymmetric shape having different curvatures with respect to the first border line A-A' and the second border line B-B'. Therefore, the light directly incident to the driver's eyes may be reduced by a distribution pattern corresponding to the nearby position P2. Also, brightness at a far forward position of the driver may be increased by a distribution pattern corresponding to the far position P1.

Furthermore, the light emitted to the far position P4 in a direction toward the street 300 may be increased while the light emitted to the nearby position P3 in a direction toward the sidewalk 400 is reduced. As a result, uniformity ratio of illuminance and coefficient of utilization (CU) may be increased. Also, light pollution by unnecessary light may be prevented.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A lens comprising at least two curved surfaces to transmit light generated from a light emitting diode (LED), wherein
    light distribution angles of light passing through the at least two curved surfaces are different; and
    the at least two curved surfaces are asymmetric and defined by border lines and have different curvatures with reference to the border lines, wherein the border lines comprise:
    a first border line extending in a width direction of the lens; and
    a second border line extending in a length direction of the lens, wherein
    the first border line divides the at least two curved surfaces into a first region and a second region,
    the second border line divides the at least two curved surfaces into a third region and a fourth region,
    light passing through the first region advances to one side with respect to the first border line,
    light passing through the second region advances to the other side with respect to the first border line, the second region having a relatively steeper curve than the first region, and
    light passing through the third region advances to one side with respect to the second border line, and light passing through the fourth region advances to the other side with respect to the second border line, the fourth region having a relatively steeper curve than the third region.

2. The lens of claim 1, wherein
    the first region comprises a first curved surface and a second curved surface, and
    the second region comprises a third curved surface and a fourth curved surface.

3. The lens of claim 1, wherein
    the third region comprises a second curved surface and a fourth curved surface, and
    the fourth region comprises a first curved surface and a third curved surface.

4. A street light comprising:
    a support pole installed on a ground;
    a lighting apparatus mounted to the support pole and configured to comprise a lens which comprises at least two curved surfaces configured to transmit light generated from a light emitting diode (LED), wherein
    light distribution angles of light passing through the at least two curved surfaces are different; and
    the at least two curved surfaces are asymmetric and defined by border lines and have different curvatures with reference to the border lines, wherein the border lines comprise:
    a first border line extending in a width direction of the lens and a second border line extending in a length direction of the lens,
    the first border line divides the at least two curved surfaces into a first region and a second region,
    the second border line divides the at least two curved surfaces into a third region and a fourth region,
    light passing through the first region advances to one side with respect to the first border line and light passing through the second region advances to the other side with respect to the first border line, the second region having a relatively steeper curve than the first region, and
    light passing through the third region advances to one side with respect to the second border line and light passing through the fourth region advances to the other side with respect to the second border line, the fourth region having a relatively steeper curve than the third region.

5. The street light of claim 4, wherein
    the first region comprises a first curved surface and a second curved surface, and
    the second region comprises a third curved surface and a fourth curved surface.

6. The street light of claim 4, wherein
    the third region comprises a second curved surface and a fourth curved surface, and
    the fourth region comprises a first curved surface and a third curved surface.

7. The lens of claim 1, wherein each border line is a reference line of a cross section in which the at least two curved surfaces having the same cross section with respect to each border line belong to the same region.

8. The lens of claim 4, wherein each border line is a reference line of a cross section in which the at least two curved surfaces having the same cross section with respect to each border line belong to the same region.

* * * * *